United States Patent [19]

Cox

[11] Patent Number: 5,675,502
[45] Date of Patent: Oct. 7, 1997

[54] ESTIMATING PROPAGATION DELAYS IN A PROGRAMMABLE DEVICE

[75] Inventor: William Douglas Cox, San Jose, Calif.

[73] Assignee: QuickLogic Corporation, Sunnyvale, Calif.

[21] Appl. No.: 517,871

[22] Filed: Aug. 22, 1995

[51] Int. Cl.$^6$ .................................................. G01V 3/20
[52] U.S. Cl. ................................... 364/490; 364/578
[58] Field of Search ........................... 395/500; 364/578, 364/488, 489, 490, 491, 569; 371/23; 326/41, 46; 324/629, 639

[56] References Cited

U.S. PATENT DOCUMENTS

| 3,500,184 | 3/1970 | Irving | 324/57 |
| 3,570,143 | 3/1971 | Moore et al. | 35/19 |
| 3,631,232 | 12/1971 | Perreault et al. | 235/185 |
| 4,635,218 | 1/1987 | Widdoes, Jr. | 364/578 |
| 4,791,593 | 12/1988 | Hennion | 364/578 |

(List continued on next page.)

OTHER PUBLICATIONS

William H. Press et al., "Numerical Recipes in C, The Art of Scientific Computing", Cambridge University Press, pp. 734–747, (1992).
1994 QuickLogic Data Book, pp. 1–5 to 1–16, 2–1 to 2–16, (1994).
1994 Actel FPGA Data Book and Design Guide, pp. ii to xii, 1–31 to 1–77, 5–3 to 5–6 (1993).
1994 Xilinx Data Book, pp. 2–1 to 2–46 (1994).
Stephen M. Trimberger, "Field–Programmable Gate Array Technology", pp. viii–x, 1–14 (1994).
Pillage et al., "Electronic Circuit and System Simulation Methods", McGraw–Hill Books, pp. 75–86 and 113 (1995).
Rohrer, et al., "Quasi–Static Control of Explicit Algorithms for Transient Analysis", IEEE Transactions on Computer–Aided Design, vol. CAD–3, No. 3, pp. 227–234, Jul. (1984).
Rohrer, et al., "A Modified Forward Euler Approach to Stable Step Response Computations", IEEE Transactions on Circuits and Systems, vol. CAS–28, No. 3, pp. 180–186, Mar. (1981).
Brayton, et al., "A New Efficient Algorithm for Solving Differential–Algebraic Systems Using Implicit Backward Differentiation Formulas", Proceedings of the IEEE, vol. 60, No. 1, pp. 98–108, Jan. (1972).
Kuh, et al., "The State–Variable Approach to Network Analysis", Proceedings of the IEEE, pp. 672–686 (1965).
Rabbat, et al., "A Latent Macromodular Approach to Large–Scale Sparse Networks", IEEE Transactions on Circuits and Systems, vol. CAS–23, No. 12, pp. 745–752, Dec. (1976).
Nagel, et al., "Computer Analysis of Nonlinear Circuits, Excluding Radiation (Cancer)", IEEE Journal of Solid–State Circuits, vol. SC–6, No. 4, pp. 166–182, Aug. (1971).

*Primary Examiner*—Kevin J. Teska
*Assistant Examiner*—Dan Fiul
*Attorney, Agent, or Firm*—Skjerven, Morrill, MacPherson, Franklin and Friel; T. Lester Wallace

[57] ABSTRACT

Node voltages in a net involving non-linear circuit elements are estimated, successively from one point in time to the next, without a computation-intensive step of solving a set of simultaneous equations. An RC tree representing the net is obtained by modeling circuit elements with resistors, capacitors and voltage sources. Voltages on nodes of the RC tree at a second point in time are then estimated given voltages on the nodes at a previous point in time, by: 1) performing a circuit substitution that enforces a backward stepping rule, and 2) performing a DC analysis thereby obtaining node voltages at the second point in time. In this way, estimated node voltages at successive points in time are obtained by repeating the circuit substitution for the next point in time and by repeating the DC analysis to obtain node voltages at the next point in time. The length of time required for the voltage on a selected node to reach a threshold voltage is the estimated propagation delay.

18 Claims, 9 Drawing Sheets

U.S. PATENT DOCUMENTS

| | | | |
|---|---|---|---|
| 4,815,024 | 3/1989 | Lewis | 364/802 |
| 4,873,459 | 10/1989 | Gamal et al. | 307/465 |
| 4,918,643 | 4/1990 | Wong | 364/802 |
| 4,939,681 | 7/1990 | Yokomizo et al. | 364/578 |
| 5,025,402 | 6/1991 | Winkelstein | 364/578 |
| 5,047,971 | 9/1991 | Horwitz | 364/578 |
| 5,055,718 | 10/1991 | Galbraith et al. | 307/465 |
| 5,105,374 | 4/1992 | Yoshida | 364/578 |
| 5,122,685 | 6/1992 | Chan et al. | 307/465.1 |
| 5,297,066 | 3/1994 | Mayes | 364/578 |
| 5,353,433 | 10/1994 | Sherman | 395/550 |
| 5,379,231 | 1/1995 | Pillage et al. | 364/488 |
| 5,400,270 | 3/1995 | Fukui et al. | 364/578 |
| 5,408,638 | 4/1995 | Sagawa et al. | 395/500 |

|  | TIME PERIOD | NODE VOLTAGES (VOLTS) | | | | | | | | NON-LINEAR COMPONENT VALUES (CAPACITORS IN fF) | | | | | | | | | | | |
|---|---|---|---|---|---|---|---|---|---|---|---|---|---|---|---|---|---|---|---|---|---|
|  | INPUT VOLTAGE | | | | | | | | | | | | | | | | | | | | |
| TIME | VIN | Vc1 | Vc2 | Vc3 | Vc4 | Vc5 | Vc6 | Vc7 | Vc8 | Vd | Rd | Vpt | Rpt | C1 | C2 | C3 | C4 | C5 | C6 | C7 | C8 |
| T0 | 5.0 | 0.0 | 0.0 | 0.0 | 0.0 | 0.0 | 0.0 | 0.0 | 0.0 | 0.0 | 150.0 | 0.0 | 50.0 | 200.0 | 200.0 | 200.0 | 200.0 | 200.0 | 200.0 | 200.0 | 200.0 |
| T1 | 4.9 | 0.0 | 0.0 | 0.0 | 0.0 | 0.0 | 0.0 | 0.0 | 0.0 | 0.1 | 158.0 | 0.0 | 50.0 | 200.0 | 200.0 | 200.0 | 200.0 | 200.0 | 200.0 | 200.0 | 200.0 |
| T2 | 4.8 | 0.0 | 0.0 | 0.0 | 0.0 | 0.0 | 0.0 | 0.0 | 0.0 | 0.2 | 167.7 | 0.0 | 50.0 | 200.0 | 200.0 | 200.0 | 200.0 | 200.0 | 200.0 | 200.0 | 200.0 |
| T3 | 4.8 | 0.0 | 0.0 | 0.0 | 0.0 | 0.0 | 0.0 | 0.0 | 0.0 | 0.2 | 177.5 | 0.0 | 50.0 | 200.0 | 200.0 | 200.0 | 200.0 | 200.0 | 200.0 | 200.0 | 200.0 |
| T4 | 4.7 | 0.1 | 0.0 | 0.0 | 0.0 | 0.0 | 0.0 | 0.0 | 0.0 | 0.3 | 186.9 | 0.0 | 50.0 | 200.0 | 200.0 | 200.0 | 200.0 | 200.0 | 200.0 | 200.0 | 200.0 |
| T5 | 4.6 | 0.1 | 0.0 | 0.0 | 0.0 | 0.0 | 0.0 | 0.0 | 0.0 | 0.4 | 195.7 | 0.0 | 50.0 | 200.0 | 200.0 | 200.0 | 200.0 | 200.0 | 200.0 | 200.0 | 200.0 |
| T6 | 4.5 | 0.1 | 0.0 | 0.0 | 0.0 | 0.0 | 0.0 | 0.0 | 0.0 | 0.5 | 203.8 | 0.0 | 50.0 | 200.0 | 200.0 | 200.0 | 200.0 | 200.0 | 200.0 | 200.0 | 200.0 |
| T7 | 4.4 | 0.1 | 0.1 | 0.0 | 0.0 | 0.0 | 0.0 | 0.0 | 0.0 | 0.6 | 211.1 | 0.0 | 50.0 | 200.0 | 200.0 | 200.0 | 200.0 | 200.0 | 200.0 | 200.0 | 200.0 |
| T8 | 4.4 | 0.1 | 0.1 | 0.0 | 0.0 | 0.0 | 0.0 | 0.0 | 0.0 | 0.6 | 217.5 | 0.0 | 50.0 | 200.0 | 200.0 | 200.0 | 200.0 | 200.0 | 200.0 | 200.0 | 200.0 |
| T9 | 4.3 | 0.2 | 0.1 | 0.1 | 0.1 | 0.0 | 0.0 | 0.0 | 0.0 | 0.7 | 223.1 | 0.0 | 50.0 | 200.0 | 200.0 | 200.0 | 200.0 | 200.0 | 200.0 | 200.0 | 200.0 |
| T10 | 4.2 | 0.2 | 0.1 | 0.1 | 0.1 | 0.0 | 0.0 | 0.0 | 0.0 | 0.8 | 227.8 | 0.0 | 50.0 | 200.0 | 200.0 | 200.0 | 200.0 | 200.0 | 200.0 | 200.0 | 200.0 |
| T11 | 4.1 | 0.2 | 0.1 | 0.1 | 0.1 | 0.1 | 0.1 | 0.0 | 0.0 | 0.9 | 231.6 | 0.0 | 50.0 | 200.0 | 200.0 | 200.0 | 200.0 | 200.0 | 200.0 | 200.0 | 200.0 |
| T12 | 4.0 | 0.2 | 0.1 | 0.1 | 0.1 | 0.1 | 0.1 | 0.1 | 0.0 | 1.0 | 234.4 | 0.0 | 50.0 | 200.0 | 200.0 | 200.0 | 200.0 | 200.0 | 200.0 | 200.0 | 200.0 |
| T13 | 4.0 | 0.3 | 0.1 | 0.1 | 0.1 | 0.1 | 0.1 | 0.1 | 0.0 | 1.0 | 242.2 | 0.0 | 50.0 | 200.0 | 200.0 | 200.0 | 200.0 | 200.0 | 200.0 | 200.0 | 200.0 |
| T14 | 3.9 | 0.3 | 0.2 | 0.2 | 0.1 | 0.1 | 0.1 | 0.1 | 0.1 | 1.1 | 255.0 | 0.0 | 50.0 | 200.0 | 200.0 | 200.0 | 200.0 | 200.0 | 200.0 | 200.0 | 200.0 |
| T15 | 3.8 | 0.3 | 0.2 | 0.2 | 0.2 | 0.1 | 0.1 | 0.1 | 0.1 | 1.2 | 267.1 | 0.0 | 50.0 | 200.0 | 200.0 | 200.0 | 200.0 | 200.0 | 200.0 | 200.0 | 200.0 |
| T16 | 3.7 | 0.4 | 0.2 | 0.2 | 0.2 | 0.2 | 0.2 | 0.1 | 0.1 | 1.3 | 278.4 | 0.0 | 50.0 | 200.0 | 200.0 | 200.0 | 200.0 | 200.0 | 200.0 | 200.0 | 200.0 |
| T17 | 3.6 | 0.4 | 0.3 | 0.2 | 0.2 | 0.2 | 0.2 | 0.1 | 0.1 | 1.4 | 289.0 | 0.0 | 50.0 | 200.0 | 200.0 | 200.0 | 200.0 | 200.0 | 200.0 | 200.0 | 200.0 |
| T18 | 3.6 | 0.4 | 0.3 | 0.2 | 0.2 | 0.2 | 0.2 | 0.2 | 0.1 | 1.4 | 298.7 | 0.0 | 50.0 | 200.0 | 200.0 | 200.0 | 200.0 | 200.0 | 200.0 | 200.0 | 200.0 |
| T19 | 3.5 | 0.4 | 0.3 | 0.3 | 0.2 | 0.2 | 0.2 | 0.2 | 0.1 | 1.5 | 307.5 | 0.0 | 50.0 | 200.0 | 200.0 | 200.0 | 200.0 | 200.0 | 200.0 | 200.0 | 200.0 |
| T20 | 3.4 | 0.5 | 0.3 | 0.3 | 0.3 | 0.3 | 0.3 | 0.2 | 0.1 | 1.6 | 315.4 | 0.0 | 50.0 | 200.0 | 200.0 | 200.0 | 200.0 | 200.0 | 200.0 | 200.0 | 200.0 |
| T21 | 3.3 | 0.5 | 0.4 | 0.3 | 0.3 | 0.3 | 0.3 | 0.2 | 0.2 | 1.7 | 322.3 | 0.0 | 50.0 | 200.0 | 200.0 | 200.0 | 200.0 | 200.0 | 200.0 | 200.0 | 200.0 |
| T22 | 3.2 | 0.6 | 0.4 | 0.4 | 0.3 | 0.3 | 0.3 | 0.3 | 0.2 | 1.8 | 328.0 | 0.0 | 50.0 | 190.0 | 200.0 | 200.0 | 200.0 | 200.0 | 200.0 | 200.0 | 200.0 |
| T23 | 3.2 | 0.6 | 0.4 | 0.4 | 0.3 | 0.3 | 0.3 | 0.3 | 0.2 | 1.8 | 332.6 | 0.0 | 50.0 | 190.0 | 200.0 | 200.0 | 200.0 | 200.0 | 200.0 | 200.0 | 200.0 |
| T24 | 3.1 | 0.6 | 0.4 | 0.4 | 0.4 | 0.4 | 0.4 | 0.3 | 0.3 | 1.9 | 336.0 | 0.0 | 50.0 | 190.0 | 200.0 | 200.0 | 200.0 | 200.0 | 200.0 | 200.0 | 200.0 |
| T25 | 3.0 | 0.6 | 0.5 | 0.4 | 0.4 | 0.4 | 0.4 | 0.3 | 0.3 | 2.0 | 338.2 | 0.0 | 50.0 | 190.0 | 200.0 | 200.0 | 200.0 | 200.0 | 200.0 | 200.0 | 200.0 |
| T26 | 2.9 | 0.7 | 0.5 | 0.4 | 0.4 | 0.4 | 0.4 | 0.4 | 0.3 | 2.1 | 349.8 | 0.0 | 50.0 | 190.0 | 190.0 | 200.0 | 200.0 | 200.0 | 200.0 | 200.0 | 200.0 |
| T27 | 2.8 | 0.7 | 0.5 | 0.4 | 0.4 | 0.4 | 0.4 | 0.4 | 0.3 | 2.2 | 362.3 | 0.0 | 50.0 | 190.0 | 190.0 | 200.0 | 200.0 | 200.0 | 200.0 | 200.0 | 200.0 |
| T28 | 2.8 | 0.7 | 0.5 | 0.5 | 0.4 | 0.4 | 0.5 | 0.4 | 0.3 | 2.2 | 375.1 | 0.0 | 50.0 | 190.0 | 190.0 | 200.0 | 200.0 | 200.0 | 200.0 | 200.0 | 200.0 |
| T29 | 2.7 | 0.8 | 0.6 | 0.5 | 0.4 | 0.4 | 0.5 | 0.4 | 0.4 | 2.3 | 388.2 | 0.0 | 50.0 | 190.0 | 190.0 | 200.0 | 200.0 | 200.0 | 200.0 | 200.0 | 200.0 |
| T30 | 2.6 | 0.8 | 0.6 | 0.5 | 0.4 | 0.4 | 0.5 | 0.4 | 0.4 | 2.4 | 401.5 | 0.0 | 50.0 | 190.0 | 190.0 | 190.0 | 200.0 | 200.0 | 190.0 | 200.0 | 200.0 |
| T31 | 2.5 | 0.8 | 0.6 | 0.5 | 0.4 | 0.4 | 0.5 | 0.5 | 0.4 | 2.5 | 414.9 | 0.0 | 50.0 | 190.0 | 190.0 | 190.0 | 200.0 | 200.0 | 190.0 | 200.0 | 200.0 |
| T32 | 2.4 | 0.8 | 0.6 | 0.6 | 0.5 | 0.4 | 0.5 | 0.5 | 0.4 | 2.6 | 428.4 | 0.0 | 50.0 | 190.0 | 190.0 | 190.0 | 200.0 | 200.0 | 190.0 | 200.0 | 200.0 |
| T33 | 2.4 | 0.9 | 0.7 | 0.6 | 0.5 | 0.5 | 0.6 | 0.5 | 0.5 | 2.6 | 441.9 | 0.0 | 50.0 | 190.0 | 190.0 | 190.0 | 200.0 | 200.0 | 190.0 | 200.0 | 200.0 |

FIGURE 6A

| CAPACITOR CURRENTS (mA) | | | | | | | | COMPONENT VALUES OF SUBSTITUTED CIRCUIT | | | | | | | | | | | | | | | |
|---|---|---|---|---|---|---|---|---|---|---|---|---|---|---|---|---|---|---|---|---|---|---|---|
| Ic1 | Ic2 | Ic3 | Ic4 | Ic5 | Ic6 | Ic7 | Ic8 | R1 | R2 | R3 | R4 | R5 | R6 | R7 | R8 | Vs1 | Vs2 | Vs3 | Vs4 | Vs5 | Vs6 | Vs7 | Vs8 |
| 0.0 | 0.0 | 0.0 | 0.0 | 0.0 | 0.0 | 0.0 | 0.0 | 20.0 | 20.0 | 20.0 | 20.0 | 20.0 | 20.0 | 20.0 | 20.0 | 0.0 | 0.0 | 0.0 | 0.0 | 0.0 | 0.0 | 0.0 | 0.0 |
| 0.5 | 0.1 | 0.0 | 0.0 | 0.0 | 0.0 | 0.0 | 0.0 | 20.0 | 20.0 | 20.0 | 20.0 | 20.0 | 20.0 | 20.0 | 20.0 | 0.0 | 0.0 | 0.0 | 0.0 | 0.0 | 0.0 | 0.0 | 0.0 |
| 0.7 | 0.2 | 0.0 | 0.0 | 0.0 | 0.0 | 0.0 | 0.0 | 20.0 | 20.0 | 20.0 | 20.0 | 20.0 | 20.0 | 20.0 | 20.0 | 0.1 | 0.0 | 0.0 | 0.0 | 0.0 | 0.0 | 0.0 | 0.0 |
| 0.9 | 0.3 | 0.1 | 0.0 | 0.0 | 0.0 | 0.0 | 0.0 | 20.0 | 20.0 | 20.0 | 20.0 | 20.0 | 20.0 | 20.0 | 20.0 | 0.1 | 0.0 | 0.0 | 0.0 | 0.0 | 0.0 | 0.0 | 0.0 |
| 1.0 | 0.3 | 0.1 | 0.0 | 0.0 | 0.0 | 0.0 | 0.0 | 20.0 | 20.0 | 20.0 | 20.0 | 20.0 | 20.0 | 20.0 | 20.0 | 0.1 | 0.0 | 0.0 | 0.0 | 0.0 | 0.0 | 0.0 | 0.0 |
| 1.0 | 0.4 | 0.2 | 0.1 | 0.0 | 0.0 | 0.0 | 0.0 | 20.0 | 20.0 | 20.0 | 20.0 | 20.0 | 20.0 | 20.0 | 20.0 | 0.1 | 0.0 | 0.0 | 0.0 | 0.0 | 0.0 | 0.0 | 0.0 |
| 1.1 | 0.4 | 0.2 | 0.1 | 0.1 | 0.0 | 0.0 | 0.0 | 20.0 | 20.0 | 20.0 | 20.0 | 20.0 | 20.0 | 20.0 | 20.0 | 0.2 | 0.1 | 0.0 | 0.0 | 0.0 | 0.0 | 0.0 | 0.0 |
| 1.1 | 0.4 | 0.2 | 0.1 | 0.1 | 0.1 | 0.0 | 0.0 | 20.0 | 20.0 | 20.0 | 20.0 | 20.0 | 20.0 | 20.0 | 20.0 | 0.2 | 0.1 | 0.0 | 0.0 | 0.0 | 0.0 | 0.0 | 0.0 |
| 1.2 | 0.4 | 0.3 | 0.2 | 0.1 | 0.1 | 0.1 | 0.1 | 20.0 | 20.0 | 20.0 | 20.0 | 20.0 | 20.0 | 20.0 | 20.0 | 0.2 | 0.1 | 0.1 | 0.0 | 0.0 | 0.0 | 0.0 | 0.0 |
| 1.2 | 0.4 | 0.3 | 0.2 | 0.2 | 0.1 | 0.1 | 0.1 | 20.0 | 20.0 | 20.0 | 20.0 | 20.0 | 20.0 | 20.0 | 20.0 | 0.2 | 0.1 | 0.1 | 0.0 | 0.0 | 0.0 | 0.0 | 0.0 |
| 1.3 | 0.4 | 0.3 | 0.2 | 0.2 | 0.2 | 0.1 | 0.1 | 20.0 | 20.0 | 20.0 | 20.0 | 20.0 | 20.0 | 20.0 | 20.0 | 0.3 | 0.1 | 0.1 | 0.1 | 0.0 | 0.0 | 0.0 | 0.0 |
| 1.3 | 0.5 | 0.3 | 0.3 | 0.2 | 0.2 | 0.2 | 0.2 | 20.0 | 20.0 | 20.0 | 20.0 | 20.0 | 20.0 | 20.0 | 20.0 | 0.3 | 0.1 | 0.1 | 0.1 | 0.1 | 0.1 | 0.1 | 0.1 |
| 1.4 | 0.5 | 0.3 | 0.3 | 0.3 | 0.3 | 0.2 | 0.2 | 20.0 | 20.0 | 20.0 | 20.0 | 20.0 | 20.0 | 20.0 | 20.0 | 0.3 | 0.1 | 0.1 | 0.1 | 0.1 | 0.1 | 0.1 | 0.1 |
| 1.4 | 0.5 | 0.4 | 0.3 | 0.3 | 0.3 | 0.3 | 0.2 | 20.0 | 20.0 | 20.0 | 20.0 | 20.0 | 20.0 | 20.0 | 20.0 | 0.4 | 0.2 | 0.1 | 0.1 | 0.1 | 0.1 | 0.1 | 0.1 |
| 1.4 | 0.5 | 0.4 | 0.3 | 0.3 | 0.3 | 0.3 | 0.3 | 20.0 | 20.0 | 20.0 | 20.0 | 20.0 | 20.0 | 20.0 | 20.0 | 0.4 | 0.2 | 0.2 | 0.1 | 0.1 | 0.1 | 0.1 | 0.1 |
| 1.5 | 0.5 | 0.4 | 0.4 | 0.3 | 0.3 | 0.3 | 0.3 | 20.0 | 20.0 | 20.0 | 20.0 | 20.0 | 20.0 | 20.0 | 20.0 | 0.4 | 0.2 | 0.2 | 0.2 | 0.1 | 0.1 | 0.1 | 0.1 |
| 1.5 | 0.5 | 0.4 | 0.4 | 0.4 | 0.4 | 0.4 | 0.3 | 20.0 | 20.0 | 20.0 | 20.0 | 20.0 | 20.0 | 20.0 | 20.0 | 0.5 | 0.2 | 0.2 | 0.2 | 0.2 | 0.2 | 0.2 | 0.2 |
| 1.5 | 0.5 | 0.4 | 0.4 | 0.4 | 0.4 | 0.4 | 0.4 | 20.0 | 20.0 | 20.0 | 20.0 | 20.0 | 20.0 | 20.0 | 20.0 | 0.5 | 0.3 | 0.2 | 0.2 | 0.2 | 0.2 | 0.2 | 0.2 |
| 1.5 | 0.5 | 0.4 | 0.4 | 0.4 | 0.4 | 0.4 | 0.4 | 20.0 | 20.0 | 20.0 | 20.0 | 20.0 | 20.0 | 20.0 | 20.0 | 0.5 | 0.3 | 0.2 | 0.2 | 0.2 | 0.2 | 0.2 | 0.2 |
| 1.5 | 0.6 | 0.5 | 0.5 | 0.5 | 0.5 | 0.5 | 0.5 | 20.0 | 20.0 | 20.0 | 20.0 | 20.0 | 20.0 | 20.0 | 20.0 | 0.6 | 0.3 | 0.3 | 0.3 | 0.3 | 0.3 | 0.3 | 0.3 |
| 1.5 | 0.6 | 0.5 | 0.5 | 0.5 | 0.5 | 0.5 | 0.5 | 20.0 | 20.0 | 20.0 | 20.0 | 20.0 | 20.0 | 20.0 | 20.0 | 0.6 | 0.3 | 0.3 | 0.3 | 0.3 | 0.3 | 0.3 | 0.3 |
| 1.6 | 0.6 | 0.5 | 0.5 | 0.5 | 0.5 | 0.5 | 0.5 | 20.0 | 20.0 | 20.0 | 20.0 | 20.0 | 20.0 | 20.0 | 20.0 | 0.6 | 0.4 | 0.3 | 0.3 | 0.3 | 0.3 | 0.3 | 0.3 |
| 1.6 | 0.6 | 0.5 | 0.5 | 0.5 | 0.5 | 0.5 | 0.5 | 20.0 | 20.0 | 20.0 | 20.0 | 20.0 | 20.0 | 20.0 | 20.0 | 0.7 | 0.4 | 0.3 | 0.3 | 0.3 | 0.3 | 0.3 | 0.3 |
| 1.7 | 0.7 | 0.6 | 0.6 | 0.6 | 0.6 | 0.6 | 0.6 | 20.0 | 20.0 | 20.0 | 20.0 | 20.0 | 20.0 | 20.0 | 20.0 | 0.7 | 0.4 | 0.4 | 0.4 | 0.4 | 0.4 | 0.4 | 0.4 |
| 1.7 | 0.7 | 0.6 | 0.6 | 0.6 | 0.6 | 0.6 | 0.6 | 20.0 | 20.0 | 20.0 | 20.0 | 20.0 | 20.0 | 20.0 | 20.0 | 0.7 | 0.5 | 0.4 | 0.4 | 0.4 | 0.4 | 0.4 | 0.4 |
| 1.7 | 0.7 | 0.6 | 0.6 | 0.6 | 0.6 | 0.6 | 0.6 | 20.0 | 20.0 | 20.0 | 20.0 | 20.0 | 20.0 | 20.0 | 20.0 | 0.8 | 0.5 | 0.4 | 0.4 | 0.4 | 0.4 | 0.4 | 0.4 |
| 1.7 | 0.6 | 0.6 | 0.6 | 0.6 | 0.6 | 0.6 | 0.6 | 20.0 | 20.0 | 20.0 | 20.0 | 20.0 | 20.0 | 20.0 | 20.0 | 0.8 | 0.5 | 0.4 | 0.4 | 0.4 | 0.4 | 0.4 | 0.4 |
| 1.8 | 0.6 | 0.6 | 0.6 | 0.6 | 0.6 | 0.6 | 0.6 | 20.0 | 20.0 | 20.0 | 20.0 | 20.0 | 20.0 | 20.0 | 20.0 | 0.8 | 0.6 | 0.4 | 0.4 | 0.4 | 0.4 | 0.4 | 0.4 |
| 1.8 | 0.7 | 0.6 | 0.6 | 0.6 | 0.6 | 0.6 | 0.6 | 20.0 | 20.0 | 20.0 | 20.0 | 20.0 | 20.0 | 20.0 | 20.0 | 0.9 | 0.6 | 0.5 | 0.5 | 0.5 | 0.5 | 0.5 | 0.5 |
| 1.9 | 0.7 | 0.6 | 0.6 | 0.6 | 0.6 | 0.6 | 0.6 | 20.0 | 20.0 | 20.0 | 20.0 | 20.0 | 20.0 | 20.0 | 20.0 | 0.9 | 0.6 | 0.5 | 0.5 | 0.5 | 0.5 | 0.5 | 0.5 |
| 1.8 | 0.7 | 0.6 | 0.6 | 0.6 | 0.6 | 0.6 | 0.6 | 21.1 | 21.1 | 21.1 | 20.0 | 20.0 | 20.0 | 20.0 | 20.0 | 0.9 | 0.6 | 0.5 | 0.5 | 0.5 | 0.5 | 0.5 | 0.5 |
| 1.7 | 0.7 | 0.6 | 0.6 | 0.6 | 0.6 | 0.6 | 0.6 | 21.1 | 21.1 | 21.1 | 20.0 | 20.0 | 20.0 | 20.0 | 20.0 | 0.9 | 0.6 | 0.5 | 0.5 | 0.5 | 0.5 | 0.5 | 0.5 |
| 1.7 | 0.7 | 0.6 | 0.6 | 0.6 | 0.6 | 0.6 | 0.6 | 21.1 | 21.1 | 21.1 | 20.0 | 20.0 | 20.0 | 20.0 | 20.0 | 0.9 | 0.6 | 0.5 | 0.5 | 0.5 | 0.5 | 0.5 | 0.5 |
| 1.7 | 0.6 | 0.6 | 0.6 | 0.6 | 0.6 | 0.6 | 0.6 | 21.1 | 21.1 | 21.1 | 20.0 | 20.0 | 21.1 | 20.0 | 20.0 | 0.9 | 0.6 | 0.5 | 0.5 | 0.5 | 0.5 | 0.5 | 0.5 |
| 1.6 | 0.6 | 0.6 | 0.6 | 0.6 | 0.6 | 0.6 | 0.6 | 21.1 | 21.1 | 21.1 | 20.0 | 20.0 | 21.1 | 20.0 | 20.0 | 0.9 | 0.6 | 0.6 | 0.5 | 0.5 | 0.5 | 0.5 | 0.5 |
| 1.6 | 0.6 | 0.6 | 0.6 | 0.6 | 0.6 | 0.6 | 0.6 | 21.1 | 21.1 | 21.1 | 20.0 | 20.0 | 21.1 | 20.0 | 20.0 | 0.9 | 0.7 | 0.6 | 0.5 | 0.5 | 0.6 | 0.5 | 0.5 |

FIGURE 6B

| FIG. 6A | FIG. 6B |
|---|---|
| KEY TO FIG. 6 | |

| VOLTAGE ACROSS NON-LINEAR CAPACITOR | CAPACITANCE MULTIPLIER FOR A UNIT SIZED CAPACITOR |
|---|---|
| 0 | 1.0 |
| 1 | .9 |
| 2 | .8 |
| 3 | .7 |
| 4 | .6 |
| 5 | .5 |

|  | 0 | 1 | 2 | 3 | 4 | 5 |
|---|---|---|---|---|---|---|
| 0 | 1000 | 900 | 750 | 500 | 300 | 150 |
| 1 | 1100 | 750 | 500 | 250 | 200 | 250 |
| 2 | 750 | 500 | 250 | 250 | 250 | 500 |
| 3 | 500 | 250 | 250 | 250 | 500 | 750 |
| 4 | 250 | 200 | 250 | 500 | 750 | 1100 |
| 5 | 150 | 300 | 500 | 750 | 900 | 1000 |

$V_{IN}$

TABLE FOR $R_D$ (OHMS)

FIGURE 8

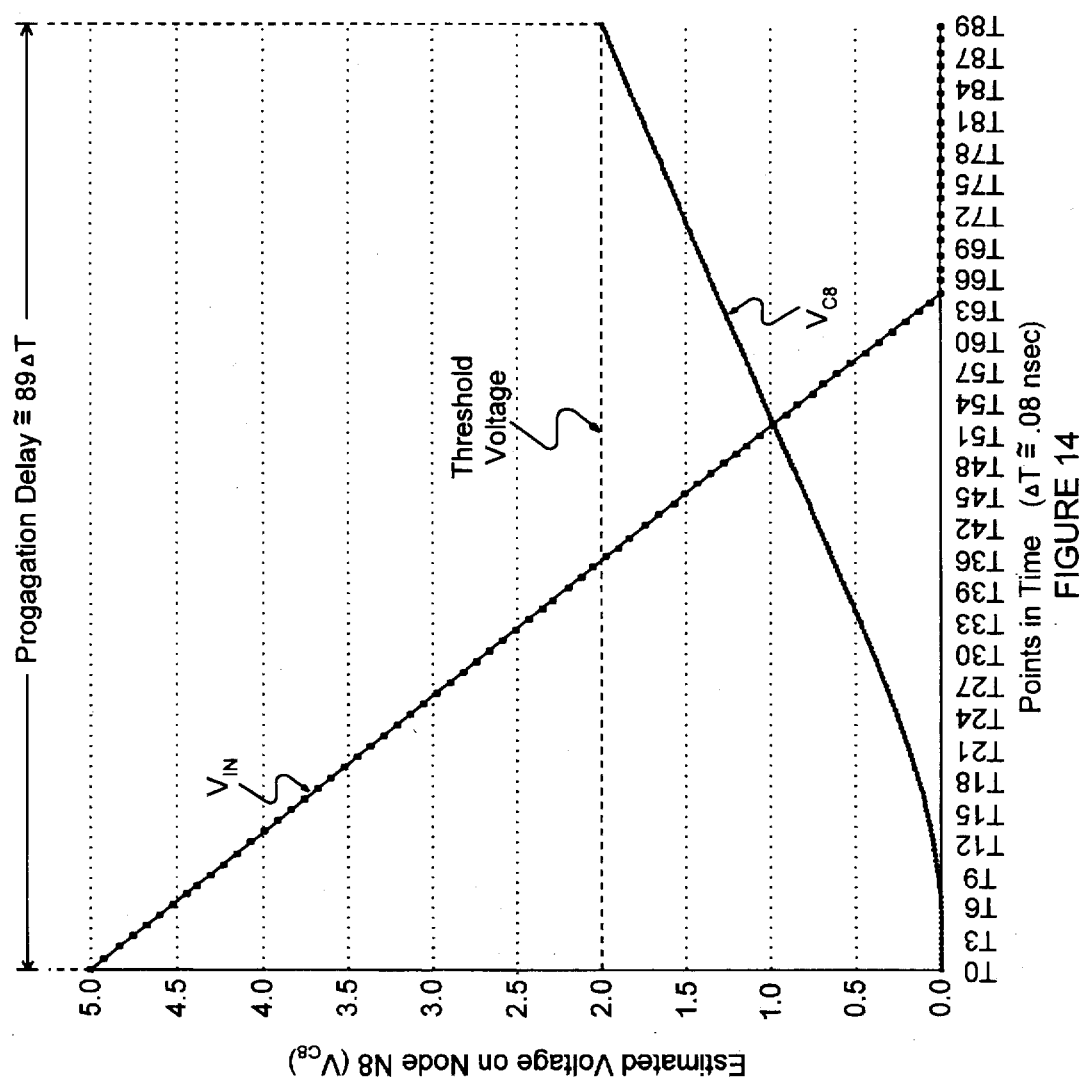

ESTIMATING PROPAGATION DELAYS IN A PROGRAMMABLE DEVICE

CROSS REFERENCE TO MICROFICHE APPENDIX

The microfiche appendix, which is a part of the present disclosure, contains one sheet of microfiche having 38 frames and is a listing of a delay estimator in accordance with an embodiment of the present invention. A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights.

FIELD OF THE INVENTION

This invention relates to the simulation of circuits. More particularly, this invention relates to estimating propagation delays in circuits including the propagation delay due to non-linear circuit elements in the interconnect of field programmable gate arrays.

BACKGROUND INFORMATION

A field programmable gate array (FPGA) is an integrated circuit which includes a plurality of blocks of logic and a configurable interconnect structure. To realize a circuit desired by the user on a field programmable gate array, the interconnect structure is configured so that logic in the blocks of logic is interconnected in such a way that the resulting circuit is the circuit desired by the user.

Before actually configuring the interconnect structure of the FPGA, the logic of the FPGA as configured will typically be "simulated". The simulation may indicate that the configuration will not realize the desired circuit satisfactorily or that a different configuration would be superior. The user may therefore simulate various different configurations before settling on a specific configuration for realization in actual hardware.

A tool called a "digital simulator" is used to simulate the operation of large digital logic circuits. The circuit to be simulated is generally supplied to the digital simulator by what is called a "netlist". A netlist contains a list of the circuit elements in the circuit along with a description of how those circuit elements are interconnected. A netlist generally also contains information indicating the propagation delays through various circuit elements in the netlist.

In field programmable gate arrays, propagation delays may be significantly affected by the interconnect used to connect various circuit elements together. There are numerous types of structures that can be part of the interconnect. Some of these structures exhibit fairly linear behavior and others of these structures exhibit significant non-linear behavior. It is therefore desired to estimate what the propagation delays would be through various paths of FPGA interconnect were the FPGA to be configured in a particular manner taking into account both the linear and non-linear behavior of the interconnect. When such interconnect propagation delay information is estimated, it can be "back annotated" into the netlist so that the digital simulator will receive a more accurate description of the configured FPGA and so that a subsequent simulation will have improved accuracy.

The rule called the "backward trapezoid rule" can be used to estimate propagation delays due to non-linear circuit elements. Some SPICE simulation tools are believed to use the backward trapezoid rule. Use of the backward trapezoid rule to find propagation delays in realistic circuits having a large number of circuit elements, however, generally involves a computation-intensive step of solving a large set of simultaneous equations. The computation-intensive step of inverting a matrix may, for example, be involved in solving such a large set of simultaneous equations.

A less computation-intensive method is therefore sought for estimating non-linear propagation delays in circuits.

SUMMARY

A backward stepping rule is employed to estimate node voltages of a net involving non-linear circuit elements, successively from one point in time to the next, without solving a set of simultaneous equations.

A representation of a circuit having a net is stored in a computer. An RC tree is then obtained by modeling circuit elements in the net and affecting the net with resistors, capacitors and voltage sources. Voltages on nodes of the RC tree at a second point in time are then estimated given voltages on the nodes at a previous point in time, by: 1) performing a circuit substitution that enforces a backward stepping rule, and 2) performing a DC analysis thereby obtaining node voltages at the second point in time. In this way, estimated node voltages at successive points in time are obtained by repeating the circuit substitution step for the next point in time and by repeating the DC analysis step to obtain node voltages at the next point in time. The length of time required for the voltage on the node coupled to the input of a device to reach the threshold voltage of the device is the estimated propagation delay in one embodiment. The estimated propagation delay is supplied to a digital simulator so that an accurate simulation of the circuit incorporating the net can be performed.

This summary does not purport to define the invention. The invention is defined by the appended claims.

BRIEF DESCRIPTION OF THE DRAWINGS

FIG. 6 is a table showing how various values change from point in time to point in time in accordance with an embodiment of the present invention.

FIG. 7 is a table indicating how a capacitance value might change with voltage across a non-linear capacitor.

FIG. 8 is a table indicating how a Thevenin equivalent resistance of a driver might change as a function of driver input voltage and driver output voltage.

FIG. 14 is a diagram showing the voltage on a node as estimated increasing from point in time to point in time until it reaches the threshold voltage of a device coupled to the node.

DETAILED DESCRIPTION OF THE PREFERRED EMBODIMENTS

Figure 1:
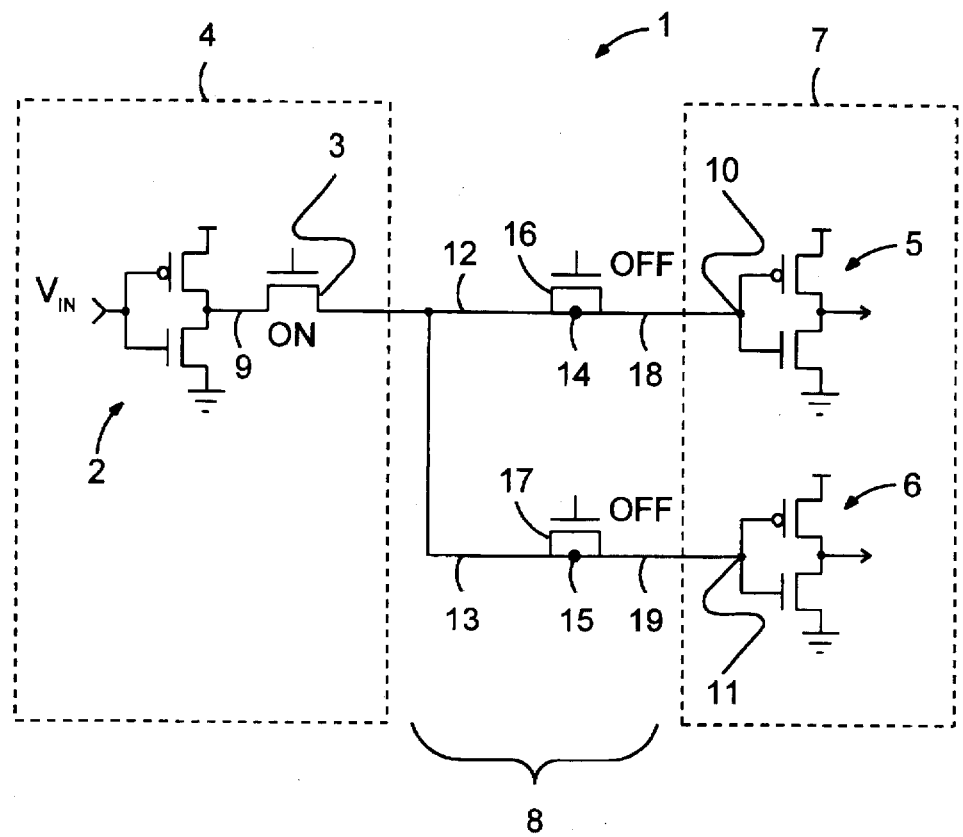
FIG. 1 is a simplified representation of a portion of a circuit through which a low-to-high propagation delay is to be estimated.

FIG. 1 is a simplified circuit diagram of a small portion of a circuit 1 which could be realized on a field programmable gate array. Circuit 1 includes an inverter 2 and a protection transistor 3 disposed in a first logic module 4, two inverters 5 and 6 in a second logic module 7, and interconnect structures 8. Before the interconnect on an actual field programmable gate array is actually configured as shown, the configuration is simulated. The structures making up the interconnect are therefore noted so that the propagation delay from the output lead 9 of inverter 2 to the input lead 10 of inverter 5 can be estimated. Once the propagation delay is estimated, the estimated propagation delay can be incorporated into a netlist for use by a digital simulator.

The interconnect includes a first conductor 12, a second conductor 13, a first programmed antifuse 14, a second programmed antifuse 15, a first nonconductive (i.e., "OFF") programming transistor 16, a second nonconductive programming transistor 17, a third conductor 18 and a fourth conductor 19. Antifuses 14 and 15 are programmed to be conductive because the output lead 9 of inverter 2 is to be coupled to the input leads 10 and 11 in the configured FPGA. Protection transistor 3 is provided between the output lead of the inverter 2 and conductors 12 and 13 so that high programming voltages present on the interconnect during antifuse programming will not damage the inverter 2. Protection transistor 13, which is controlled to be nonconductive during antifuse programming, is conductive (i.e., "ON") during normal circuit operation. Transistors 15 and 16 are pass programming transistors which may be made conductive during antifuse programming but which are controlled to be nonconductive during normal circuit operation. For additional information on protection transistors, programming transistors, and field programmable gate array architectures in general, see U.S. Pat. No. 5,122,685, U.S. Pat. No. 4,873,459, U.S. Pat. No. 5,055,718, the 1994 QuickLogic Databook, the 1994 Actel Databook, the 1994 Xilinx Databook, and the book entitled "Field-Programmable Gate Array Technology" by S. Trimberger (1994). The subject matter of these documents is incorporated herein by reference.

Many of the structures of FIG. 1 have non-linear properties which may significantly impact propagation delay. Conductive protection transistor 3, for example, can be modeled as including a non-linear capacitor coupled to the output lead of inverter 2 and as including a non-linear capacitor coupled to the left side of conductors 12 and 13. (A non-linear capacitor has a capacitance which changes as a function of the voltage across the capacitor.) The non-linear capacitance of such a protection transistor may be due to a non-linear source-to-Pwell capacitance and a non-linear drain-to-Pwell capacitance.

Similarly, each of the conductors 12, 13, 18 and 19 of the circuit can be modeled as including a non-linear capacitor. Moreover, nonconductive programming transistors can be modeled as including non-linear capacitors. Programming transistor 16, for example, can be modeled as adding a non-linear capacitor to the right end of conductor 12 and as adding a non-linear capacitor to the left end of conductor 18. Furthermore, the gates of the P-channel and N-channel field effect transistors of the circuit elements being driven can be modeled as including non-linear capacitors. The gates of the transistors of inverter 5, for example, can be modeled as adding a non-linear capacitor to the right end of conductor 18.

A method is set forth below which estimates the propagation delay from the output lead 9 of inverter 2 to the input lead 10 of inverter 5 taking such non-linearities into account. It is to be understood, however, that the circuit 1 is only representative of circuits the propagation delays of which can be estimated. Concepts disclosed in this patent disclosure extend to estimating propagation delays in circuits other than circuits typically found in field programmable gate arrays.

Figure 2:
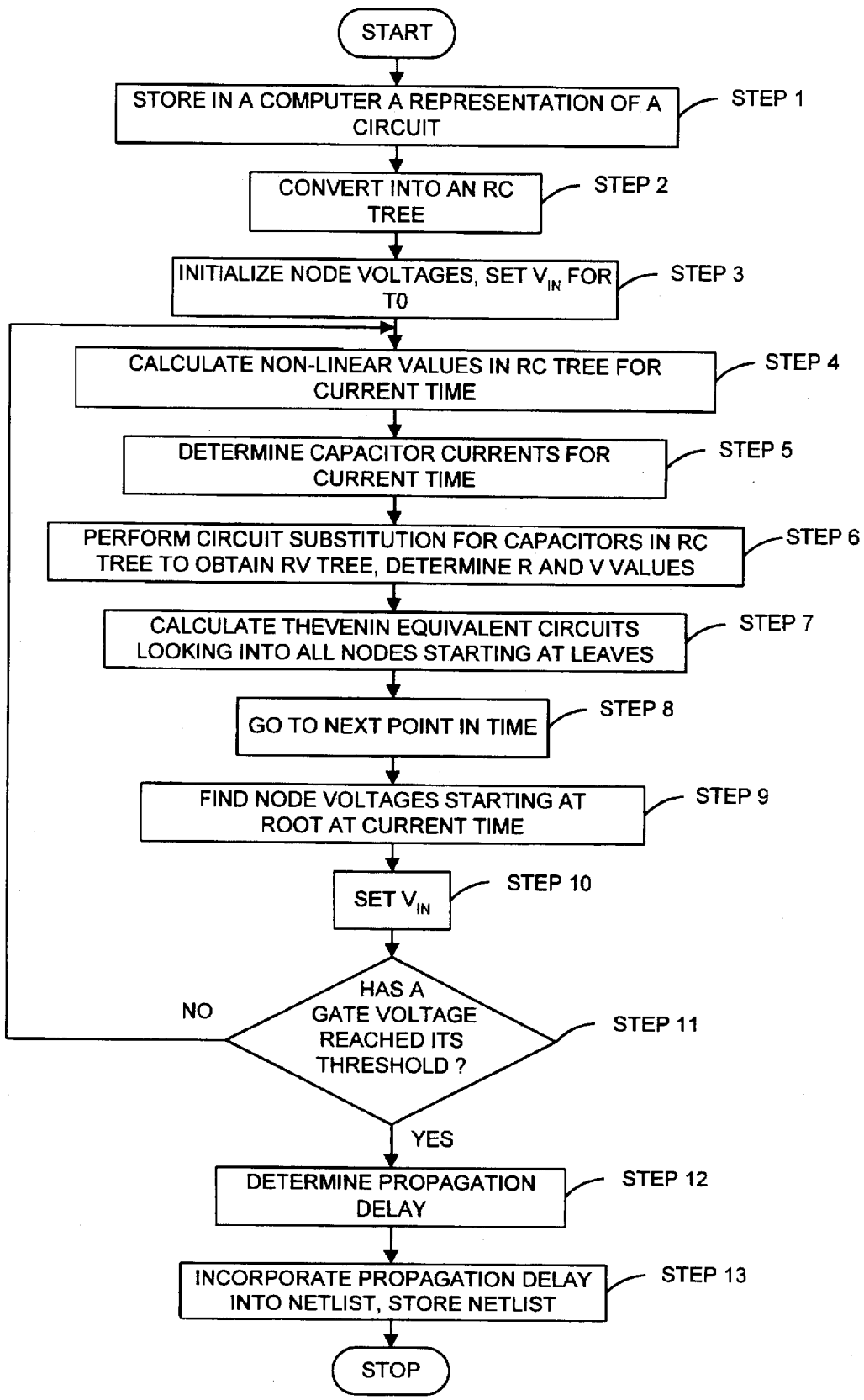
FIG. 2 is a flowchart illustrating a method of estimating a propagation delay through the circuit of FIG. 1.

FIG. 2 is a flowchart illustrating a method of estimating a propagation delay from output 9 of inverter 2 to the gate 10 of inverter 5. Initially (step 1), a representation of circuit 1 is stored in a computer generally in the form of a netlist. The computer may be, for example, a personal computer or an engineering workstation. A representation of circuit 1 (for example, a schematic representation) may be displayable on the screen of the computer for observance by a person using the computer. There are numerous forms of netlists and any suitable netlist form can be used which describes the interconnection of circuit elements.

Figure 3:
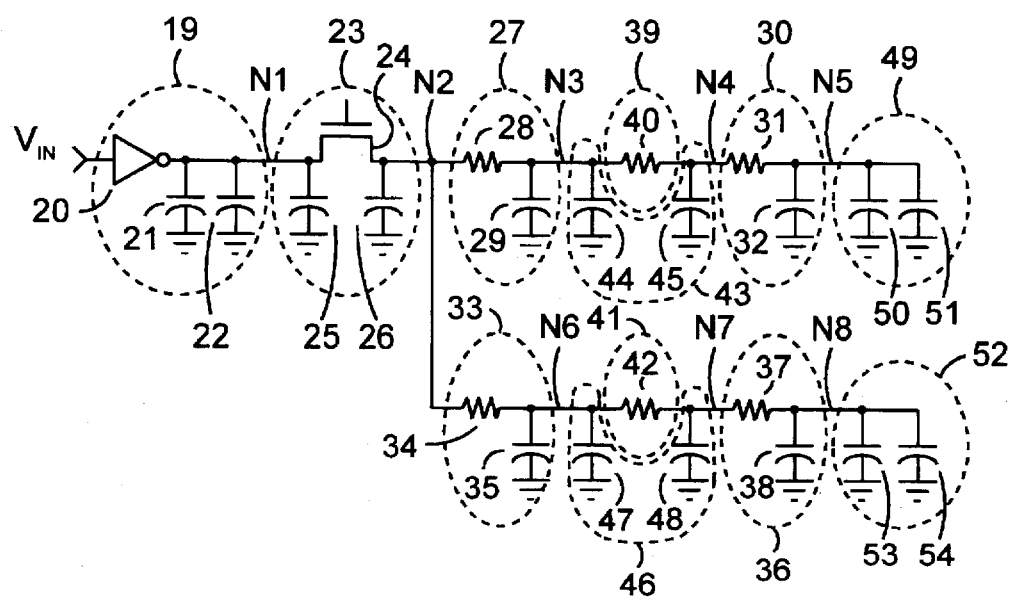
FIGS. 3–5 illustrate the conversion of the representation of FIG. 1 into an RC tree.
Figure 4:
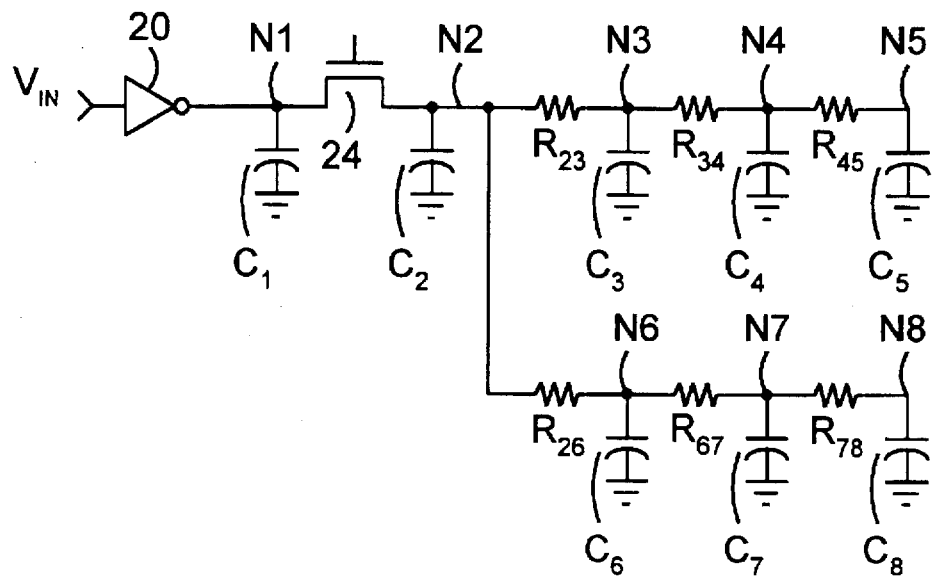
Figure 5:
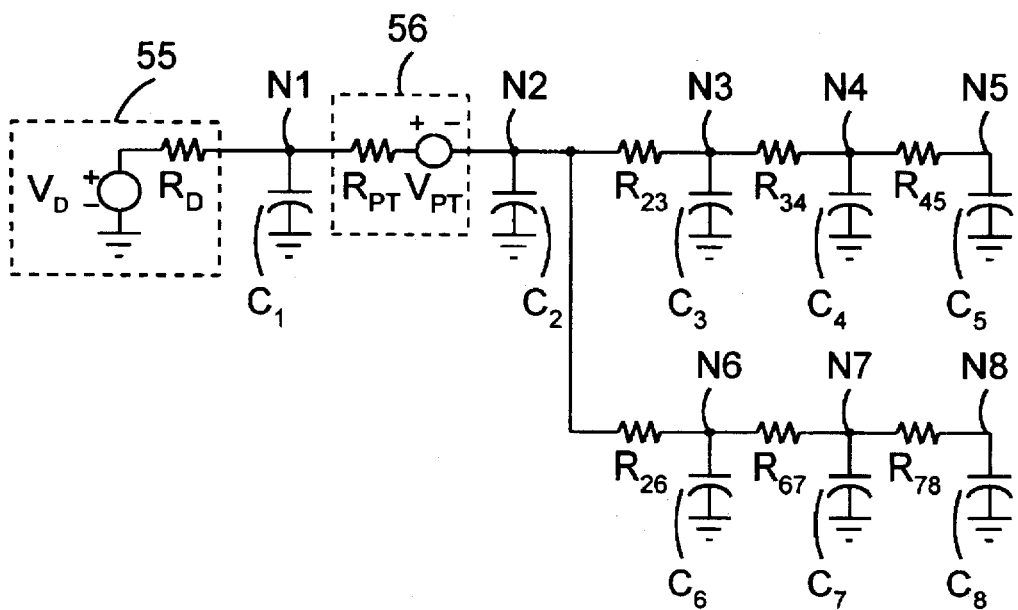

Next (step 2), a representation (called an "RC tree") is developed from the stored representation. FIGS. 3, 4 and 5 illustrate a conversion of the circuit representation of FIG. 1 into the RC tree representation of FIG. 5. As shown in FIG. 3, inverter 2 of FIG. 1 is replaced with a model 19 having an ideal inverter 20, a first drain capacitor 21 to model the drain capacitance of the P-channel transistor of inverter 2, and a second drain capacitor 22 to model the drain capacitance of the N-channel transistor of inverter 2. Protection transistor 3 of FIG. 1 is replaced with a model 23 having a transistor 24, a drain capacitor 25 modeling the drain capacitance of transistor 3, and a source capacitor 26 modeling the source capacitance of transistor 3. Conductor 12 of FIG. 1 is replaced with a model 27 having a resistor 28 and a capacitor 29. Similarly, conductor 18 of FIG. 1 is replaced with a model 30 having a resistor 31 and a capacitor 32, conductor 13 of FIG. 1 is replaced with a model 33 having a resistor 34 and a capacitor 35, and conductor 19 of FIG. 1 is replaced with a model 36 having a resistor 37 and a capacitor 38. Programmed antifuse 14 of FIG. 1 is replaced with a model 39 having a resistor 40 and programmed antifuse 15 of FIG. 1 is replaced with a model 41 having a resistor 42. Nonconductive programming transistor 16 of FIG. 1 is replaced with model 43 having a drain capacitor 44 and a source capacitor 45. Similarly, nonconductive programming transistor 17 of FIG. 1 is replaced with model 46 having a drain capacitor 47 and a source capacitor 48. The gates of the transistors of inverter 5 of FIG. 1 have capacitances. Accordingly, model 49 includes P-channel gate capacitor 50 and N-channel gate capacitor 51. Similarly, model 52 models the capacitance due to the gates of inverter 6. Model 52 includes P-channel gate capacitor 53 and N-channel gate capacitor 54. The nodes of FIG. 3 are labeled N1–N8 as shown.

FIG. 4 shows a simplified version of FIG. 3 wherein various capacitances have been combined. For example, capacitors 21, 22 and 25 of FIG. 3 are combined and illustrated in FIG. 4 as one capacitor $C_1$. The capacitors of FIG. 4 are labeled $C_1$–$C_8$ as shown. The resistors are relabeled to denote the nodes between which they are disposed. For example, resistor 28 of FIG. 3 is disposed between nodes N2 and N3 in FIG. 3 and is therefore labeled $R_{23}$ in FIG. 4. The other resistors $R_{34}$, $R_{45}$, $R_{26}$, $R_{67}$ and $R_{78}$ are similarly labeled.

FIG. 5 shows an RC tree. Inverter 20 of FIG. 4 is a non-linear component and is replaced with model 55 including voltage source $V_D$ and resistor $R_D$. (The "D" denotes "driver" because inverter 20 is a driver in that it drives the net for which the propagation delay is being estimated.) The resistance $R_D$ and the voltage $V_D$ constitute the Thevenin equivalent circuit looking into the output of the driver. Similarly, conductive protection transistor 24 of FIG. 4 (which is modeled as a non-linear component) is replaced with model 56 including resistor $R_{PT}$ and voltage source $V_{PT}$. The entire tree of FIG. 5 is called an RC tree even though voltage sources are present in the tree. This completes step 2 in the flowchart of FIG. 2.

Next (step 3), the voltages $V_{C1}$ through $V_{C8}$ on all nodes of the tree are initialized. If, for example, the low-to-high propagation delay is to be estimated, then all nodes are assumed to rest at the low potential (for example, 0 volts) at time T0. If, on the other hand, the high-to-low propagation delay is to be estimated, then all nodes would be assumed to rest at the high potential (for example, 5 volts) at time T0. Here the low-to-high propagation delay is sought.

FIG. 6 is a table showing how various values change from point in time to point in time as the method is performed. Note that for time T0 (the first row of the table), nodes voltages $V_{C1}$–$V_{C8}$ are zero. As indicated in FIG. 2, the input voltage $V_{IN}$ is set at time T0. Because a low-to-high propagation delay is to be estimated, $V_{IN}$ is initially set to 5.0 volts so that the inverter will initially drive the net with zero volts. (It is to be understood that references to points in time refer to simulated points in time with respect to a simulated operation of the circuit. Reference is not being made to actual moments in real time.)

Next (step 4), the values of the non-linear components in the RC tree of FIG. 5 are determined for the current time. The current time for the first pass through the method is time T0. The non-linear components in the RC tree are $V_D$, $R_D$, $V_{PT}$, $R_{PT}$, $C_1$, $C_2$, $C_3$, $C_4$, $C_5$, $C_6$, $C_7$, $C_8$. The value of a non-linear component may be determined in any one of many ways including lookup tables and equations.

In the described example, the capacitance value of capacitor $C_1$ is determined using the table of FIG. 7. The voltage $V_{C1}$ on node 1 and across capacitor $C_1$ was initialized to zero at time T0 as is shown in FIG. 7. As shown in the first row of the table of FIG. 7, the capacitance multiplier for a voltage of zero volts across a capacitor is 1.0. Because capacitor $C_1$ has a size of 0.2 pF, the capacitance value of capacitor $C_1$ at time T0 is 0.2 pF. Capacitance multipliers for voltages across the capacitor between the voltages in the table of FIG. 7 are found by interpolation or another suitable technique.

In the described example, the resistance value of resistor $R_D$ is determined directly using the table of FIG. 8. The voltage $V_{C1}$ on node 1 was initialized to zero at time T0 as is shown in FIG. 6 and the voltage $V_{IN}$ was set to five volts at time T0. Accordingly, the resistance value for resistor $R_D$ is 150 ohms. Again, resistances for voltages not in the table of FIG. 8 are found by interpolation or another suitable technique. The values of the remaining non-linear components in the RC tree are determined in similar ways using tables or equations. Multipliers may or may not be used.

Next (step 5), because all the node voltages are known and all the resistor values and voltage sources values are known, the capacitor currents $I_{C1}$ through $I_{C8}$ can be determined for the current point in time by summing currents into the nodes of the RC tree. For example, the current through capacitance $C_3$ is determined by noting that the voltage on node N2 is zero and the voltage on node N3 is zero. There is therefore no current flowing into node N3 through resistor $R_{23}$. Similarly, the voltage on node N4 is zero and the voltage on node N3 is zero so there is no current flowing into node N3 through resistor $R_{34}$. Accordingly, there can be no current flowing through capacitor $C_3$. The values $I_{C1}$ through $I_{C8}$ in the first row of the table of FIG. 6 are therefore determined.

Figure 9:
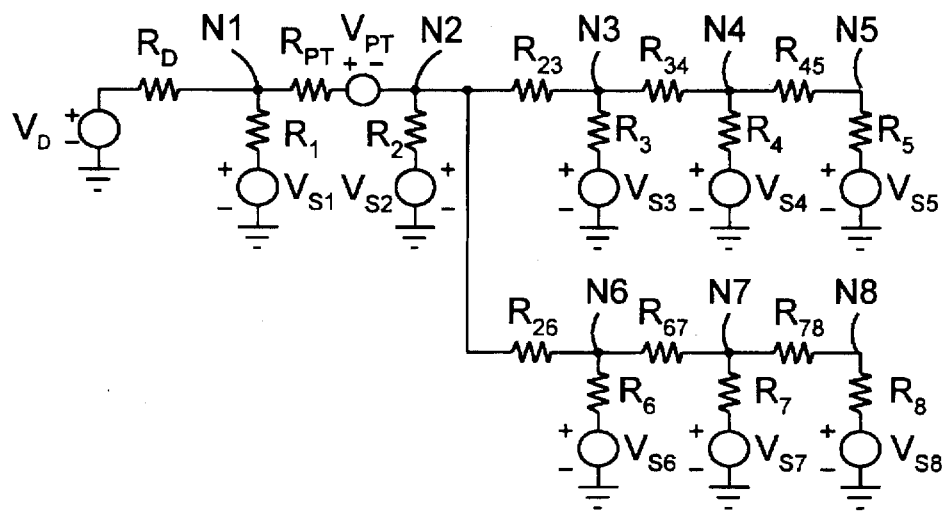
FIG. 9 is a diagram of an RV tree obtained from the RC tree of FIG. 5.

Next (step 6), a circuit substitution is performed for each capacitor in the RC tree to obtain an RV tree. FIG. 9 shows the RV tree which includes voltage sources and resistors but no non-linear capacitors. In the particular embodiment illustrated, each non-linear capacitor of FIG. 5 is replaced with a resistor coupled in series with a voltage source. The values of the resistors and voltage sources are chosen so that a backward stepping rule (the so-called "backward trapezoid rule") is enforced as discussed further below. The value of a resistor $R_i$ is given by:

$$R_i = \frac{\Delta T}{2C_i} \qquad \text{(equ. 1)}$$

where $\Delta T$ is the time between successive points in time, and where $C_i$ is the capacitance at the current time of the ith non-linear capacitor in FIG. 5 being replaced. The value of a voltage source $V_{si}$ is given by:

$$V_{si} = V_{Ci} + \left[ \frac{\Delta T I_{Ci}}{2C_i} \right] \qquad \text{(equ. 2)}$$

where $\Delta T$ is the amount of time between successive points in time, and where $I_{ci}$ is the current at the current time flowing through the ith non-linear capacitor in FIG. 5 being replaced, and where $C_i$ is the capacitance at the current time of the ith particular non-linear capacitor in FIG. 5 being replaced. With the substituted resistor $R_i$ and voltage source $V_{si}$ values determined, all values in the first row of the table of FIG. 6 are known.

Next (step 7), a Thevenin equivalent circuit is determined for the tree rooted at node N1 by determining a Thevenin equivalent circuit for each leaf of the tree, then determining the Thevenin equivalent circuit for the subtree rooted at the node adjacent the leaf, and so forth up the tree node by node toward the root N1.

Figure 10:
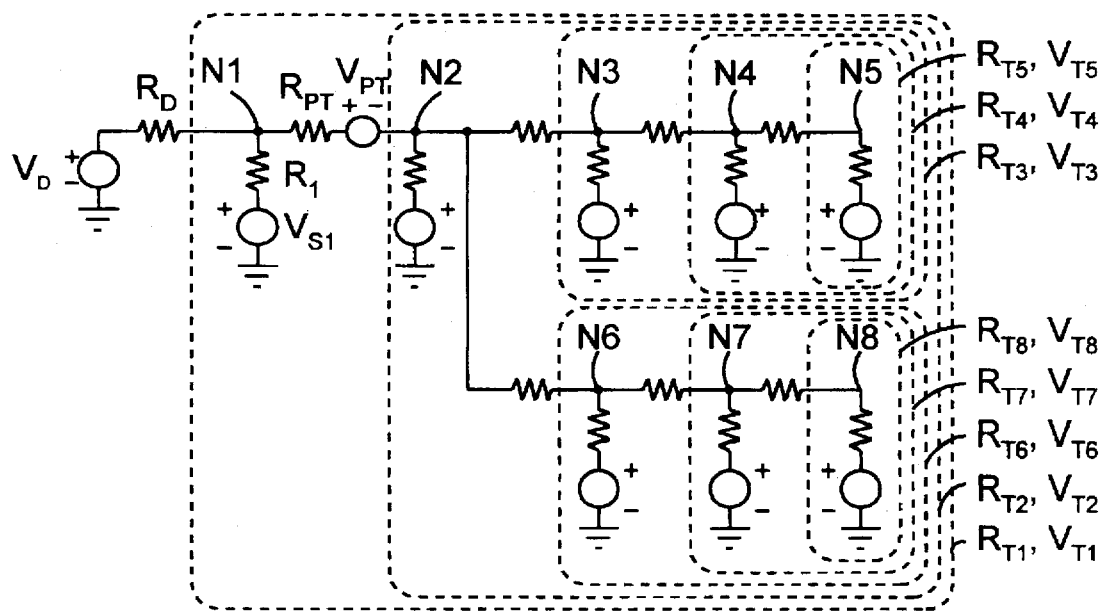
FIG. 10 illustrates a DC analysis using Thevenin equivalent circuits as performed on the RV tree of FIG. 9.
Figure 11:
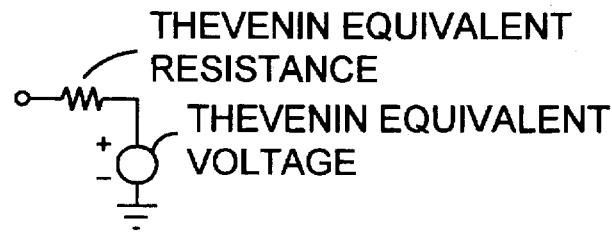
FIG. 11 is a diagram of a generalized Thevenin equivalent circuit.
Figure 12:
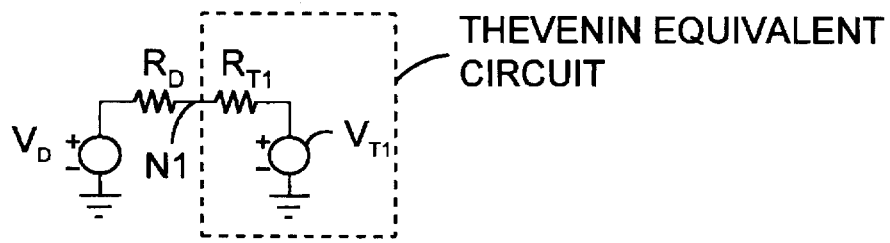
FIG. 12 is a diagram illustrating one way that a node voltage can be determined using a Thevenin equivalent circuit for the tree rooted at the node.

FIG. 10 illustrates step 7 of FIG. 2 for the RV tree of FIG. 9. First, a Thevenin equivalent circuit is determined for the leaf of the tree looking into the leaf from node N5. FIG. 11 illustrates the form of a Thevenin equivalent circuit and the values for the Thevenin equivalent resistance and the Thevenin equivalent voltage are found as is well known in the art. Looking into the leaf from node N5, the Thevenin equivalent resistance $R_{T5}$ is simply the resistance $R_5$ of FIG. 9 and the Thevenin equivalent voltage $V_{T5}$ is simply the voltage $V_{S5}$ of FIG. 9. Using the Thevenin equivalent circuit determined for the leaf, a Thevenin equivalent circuit is determined for the subtree rooted at node N4. A Thevenin equivalent resistance $R_{T4}$ and a Thevenin equivalent voltage $V_{T4}$ are thereby determined. Using the Thevenin equivalent circuit determined for the subtree rooted at node N4, a Thevenin equivalent circuit is determined for the subtree rooted at node N3. Similarly, the Thevenin equivalent circuits are determined for the leaf and successively larger subtrees in the lower branch of the tree. Using the Thevenin equivalent circuit determined for the subtrees rooted at node N3 and N6, a Thevenin equivalent circuit is determined for the subtree rooted at node N2. This process of determining Thevenin equivalent circuits from leaves upward to the root is used to determine the Thevenin equivalent circuit of the tree rooted at node N1. FIG. 12 shows the resulting tree.

Next (step 8), processing proceeds to the next point in time, point in time T1.

Figure 13:
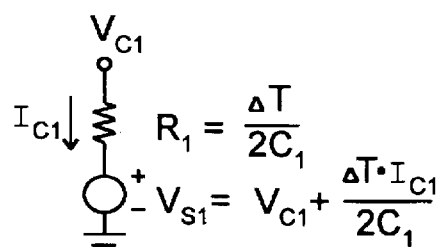
FIG. 13 is a diagram illustrating one way that a current can be estimated using a node voltage.

Next (step 9), the Thevenin equivalent circuits determined in step 7 are used to determine node voltages starting at the root of the tree (node N1) and proceeding toward the leaves of the tree. With resistances $R_D$ and $R_{T1}$ known and voltages $V_D$ and $V_{T1}$ known (see FIG. 12), the voltage on node N1 is determined. Because the voltage on node N1 is also the voltage on capacitor $C_1$ as modeled in FIG. 9 by resistor $R_1$ and voltage source $V_{S1}$, the value $V_{C1}$ in the table of FIG. 6 is determined. With the value $V_{C1}$ known the resistor $R_1$ known and the voltage $V_{S1}$ known, the current $I_{C1}$ flowing into capacitor $C_1$ may be determined as shown in FIG. 13.

Similarly, the Thevenin equivalent circuit for the subtree rooted at node N2 is used to determine the voltage $V_{C2}$ on node N2 and to determine the capacitor current $I_{C2}$. This process continues from the root to the leaves until all node voltages $V_{ci}$ and all capacitor currents $I_{ci}$ are determined.

Next (step 10), the value of $V_{IN}$ is set for the current time period (now point in time T1). The signal being supplied to inverter 2 of FIG. 1 is a sharp high-to-low ramp signal which decreases linearly a constant fraction of a volt per point in time from 5.0 volts to 0.0 volts. Accordingly, the voltage $V_{IN}$ at point in time T1 is set to 4.9 volts as shown in the table of FIG. 6. (The values of the voltages $V_{IN}$ in FIG. 6 are rounded off for clarity of the table.) It is to be understood that signals other than ramp signals (including, for example, step signals) could be simulated on the input of inverter 2.

Next (step 11), the voltage on the node coupled to the gate 10 of inverter 5 is examined to determine if the voltage has reached the switching threshold of the device being driven. In the example of FIG. 1, the propagation delay being estimated is from node N1 to N5. The low-to-high switching threshold voltage of the inverter 5 coupled to node N5 could be, for example, 2.0 volts. Accordingly, a determination is made as to whether the voltage $V_{C8}$ has reached 2.0 volts. If no, then processing returns to step 4. If, on the other hand, the voltage $V_{C8}$ on node N8 has reached the 2.0 volt switching threshold voltage of inverter 5, then processing proceeds to step 12 where the low-to-high propagation delay is estimated. In one embodiment, the propagation delay is the total difference in time (time step magnitude multiplied by the number of time steps taken) from time T0 to the current time when the result of step 11 was true.

FIG. 14 shows the voltage on node N8 as estimated increasing from point in time to point in time until it reaches the 2.0 threshold voltage of inverter 5 around point in time T89. The propagation delay is therefore estimated to be approximately 89 time steps of about 0.08 nanoseconds for a total propagation delay of about 7.12 nanoseconds.

Next (step 13), the low-to-high propagation delay so estimated is incorporated into the netlist which described the circuit 1 of FIG. 1 and this netlist is stored in the computer for future use. A digital simulator can read the netlist and use the estimated propagation delay information to achieve more accurate digital simulations of the circuit 1.

The particular substitution of equations 1 and 2 is made so that a backward stepping rule known as the "backward trapezoid rule" will be enforced. The backward trapezoid rule is given by equation 3 below:

$$V'_{ci} = V_{ci} + \Delta T \left[ \frac{\dot{V}_{ci} + \dot{V}'_{ci}}{2} \right] \quad \text{(equ. 3)}$$

$V'_{ci}$ is the voltage on a non-linear capacitor i at the next point in time. $V_{ci}$ is the voltage on the non-linear capacitor at the current point in time. $\Delta T$ is the amount of time between time points. $\dot{V}_{ci}$ is the derivative of the voltage on the non-linear capacitor at the current point in time. $\dot{V}'_{ci}$ is the derivative of the voltage on the non-linear capacitor at the next point in time. Accordingly, the voltage on one of the nodes in the RC tree at a second point in time is dependent upon the voltage on that node at the previous point in time and on the rate of change of the voltage on that node at the second point in time. The rule of equation 3 is therefore called a "backward" stepping technique.

Using the standard capacitor equation of equation 4 below:

$$I = C \frac{dV}{dt} \quad \text{(equ. 4)}$$

it is noticed that $$\frac{I_{ci}}{C_i}$$

can be substituted for $\dot{V}_{ci}$ in equation 3 and that $$\frac{I_{ci}}{C_i}$$

can be substituted for $\dot{V}'_{ci}$. Solving for $V'_{ci}$ and rearranging terms so that the future voltage $V'_{ci}$ is a linear function of the future current $I'_{ci}$ at a given time step yields:

$$V'_{ci} = \frac{\Delta T}{2C_i} I'_{ci} + \left[ V_{ci} + \frac{\Delta T \cdot I_{ci}}{2C_i} \right] \quad \text{(equ. 5)}$$

Figure 15:
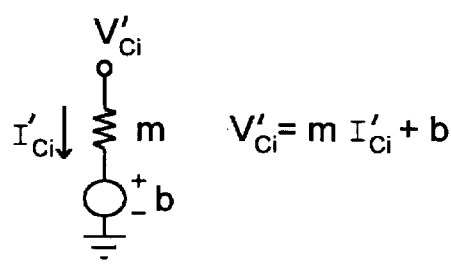
FIG. 15 illustrates the linear quality of a circuit substitution in accordance with an embodiment of the present invention.

Equation 5 is "linear" in that the equation is in the y=mx+b form. It is therefore seen (see FIG. 15) that a resistor and voltage source will enforce the y=mx+b form equation if the resistor has a magnitude m, the voltage source has a magnitude b, and the current flowing through the resistor has a magnitude of $I'_{ci}$.

Doing a DC analysis on the substituted circuit results in the same solution for the future node voltages $V'_{ci}$ because the n node equations and n branch equations for the substituted circuit are the same 2n equations as the n node equations for the unsubstituted circuit and the n equations given by equation 5. (Equation 5 is n equations because i ranges from 1 to n.)

It is to be understood that the present invention is to extend to the use of backward stepping rules (other than the specific backward trapezoid rule illustrated here) where circuit substitutions (step 6) can be made to enforce the other backward stepping rule in accordance with the present teachings. One such backward stepping rule is the "backward Euler" backward stepping rule.

In some embodiments, the proportion of the different types of capacitances in the composite capacitors $C_1$ through $C_8$ are maintained as attributes of the capacitors $C_1$ through $C_8$. When the non-linear values are determined in step 4, the different capacitor components can be determined using different tables and/or equations and then combined to generate the non-linear values of step 4.

In some embodiments, different time steps are used for different nets such that the number of steps required for propagation delay estimation is roughly the same number on all nets. In some embodiments, multiple step sizes are used in the estimation of the same propagation delay.

Although certain specific exemplary embodiments are described above in order to illustrate the invention, the invention is not limited to the specific embodiments. It is to be understood that the circuit substitution is described herein in conceptual terms and that an actual physical substitution of electrical components is not necessarily being performed. Similarly, substituting new R and V values for existing substituted elements in an RV tree may be described as forming a new RV tree or as merely determining new values of elements already in an existing RV tree. The described RC and RV trees are conceptual trees and the representations of those trees can take multiple forms when the trees are stored in a computer performing the inventive method. Known backward stepping rules other than the backward trapezoid rule can be employed by employing appropriate circuit substitutions in a similar fashion to the way the circuit substitution employing the backward stepping techniques was employed in the specific embodiment. The method is applicable to estimating propagation delays where the non-linear behavior of circuit components is ignored and not modeled. Accordingly, various modifications, adaptations, and combinations of various features of the described embodiments can be practiced without departing from the scope of the invention as set forth in the following claims.

What is claimed is:

1. A method comprising:
   (a) storing in a computer a representation of a circuit;
   (b) converting said representation into an RC tree, said RC tree having nodes and branches;
   (c) determining voltages on said nodes at a second point in time given voltages on said nodes at a previous point in time, by:
   (c1) obtaining an RV tree, said RV tree having nodes corresponding with said nodes of said RC tree, said RV tree having branches corresponding with said branches of said RC tree; and
   (c2) doing a DC analysis and thereby obtaining said voltages on said nodes in said RC tree at said second point in time, said DC analysis involving determining a Thevinen or Norton equivalent for a subtree of the RV tree rooted at a node in the RV tree; and
   (d) repeating (c) for successive points in time to estimate a propagation delay of said circuit.

2. The method of claim 1, wherein said RV tree is obtained at least in part by making circuit substitutions for elements in said RC tree.

3. The method of claim 1, further comprising:
   annotating a netlist representative of a circuit with said estimated propagation delay.

4. The method of claim 1, wherein said determining (c) involves enforcing a backward stepping rule.

5. The method of claim 4, wherein said backward stepping rule is chosen from the group consisting of: a backward Euler rule and a backward trapezoid rule.

6. The method of claim 1, wherein the voltage at one of said nodes in the RC tree at said second point in time is dependent upon the voltage at said one node at the previous point in time and the rate of change of the voltage at said one node at the second point in time.

7. The method of claim 1, wherein said RC tree comprises a plurality of capacitors, a plurality of resistors, and at least one voltage source.

8. The method of claim 1, wherein said RV tree consists of voltage sources and resistors.

9. The method of claim 7, wherein at least one of said capacitors is a non-linear circuit element having a capacitance which varies with a voltage across the non-linear circuit element.

10. The method of claim 2, wherein said circuit substitution involves substituting a resistor Ri and a voltage source Vi for a capacitor in the RC tree.

11. The method of claim 10, wherein said resistor Ri has a resistance given by:

$$R_i = \frac{\Delta T}{2 C_i}$$

and wherein said voltage source Vi has a voltage given by:

$$V_i = V_{Ci} + \frac{\Delta T \cdot I_{Ci}}{2 C_i}$$

wherein $\Delta T$ is the amount of time between successive points in time, wherein $I_{Ci}$ is the current at the current time flowing through the ith non-linear capacitor being replaced, and wherein $C_i$ is the capacitance at the current time of the ith particular non-linear capacitor being replaced.

12. The method of claim 1, wherein said doing DC analysis also involves:
   determining a voltage on said node using said Thevenin or Norton equivalent.

13. The method of claim 12, wherein a Thevenin equivalent is determined for each subtree of said RV tree and wherein the voltages present on all nodes of said RV tree are determined.

14. The method of claim 13, wherein the Thevenin equivalent for a subtree rooted at a first node of said RV tree is determined using the Thevenin equivalent for a subtree rooted at a second node of said RV tree, said second node being a child node of said first node.

15. A method of estimating a propagation delay, comprising:
   storing a second representation of a circuit by replacing a capacitor in a first representation of said circuit with a resistance Ri and a voltage source Vi, said second representation having a plurality of nodes, said resistance Ri having a first value R1 at a first point in time and said voltage source having a first value V1 at said first point in time;

using R1 and V1 to estimate voltages on said plurality of nodes in said second representation at a second point in time;

determining a second value R2 of said resistance Ri and a second value V2 of said voltage source Vi; and using R2 and V2 to estimate voltages on said plurality of nodes in said second representation at a third point in time; and using at least one of the estimated voltage values V1 and V2 to estimate said propagation delay, wherein said propagation delay is estimated based in part on the time at which the voltage on a node is estimated to reach a predetermined voltage.

16. A computer implemented method, comprising:
   storing in a computer a representation of a circuit having a net; and using said computer to estimate a propagation delay through said net using a backward stepping rule without solving a set of simultaneous equations, involving:

(a) generating a model for said net, said model having nodes;

(b) determining voltages on said nodes at a second point in time given voltages on said nodes at a previous point in time using said backward stepping rule; and (c) repeating step (b) from point in time to point in time to estimate said propagation delay.

17. The method of claim 16, wherein said using step involves simulating a non-linear characteristic of a circuit element coupled to said net.

18. The method of claim 16, further comprising:

storing in said computer a netlist containing propagation delay information determined in said using step.

* * * * *